United States Patent [19]

Okino

[11] Patent Number: 5,567,949

[45] Date of Patent: Oct. 22, 1996

[54] CHARGED PARTICLE BEAM TRANSFER APPARATUS

[75] Inventor: Teruaki Okino, Kanagawa-ken, Japan

[73] Assignee: Nikon Corporation, Tokyo, Japan

[21] Appl. No.: 545,506

[22] Filed: Oct. 19, 1995

[30] Foreign Application Priority Data

Oct. 26, 1994 [JP] Japan .................................. 6-262281

[51] Int. Cl.⁶ .................................................. H01L 21/30
[52] U.S. Cl. .................................................. 250/492.23
[58] Field of Search ........................ 250/492.23; 430/296

[56] References Cited

U.S. PATENT DOCUMENTS

| | | | |
|---|---|---|---|
| 3,619,608 | 11/1971 | Westerberg | 250/492.23 |
| 3,924,136 | 12/1975 | Heynick et al. | 250/492.23 |
| 5,079,112 | 1/1992 | Berger et al. | 430/4 |
| 5,130,213 | 7/1992 | Berger et al. | 430/4 |
| 5,256,881 | 10/1993 | Yamazaki et al. | 250/492.23 |
| 5,258,246 | 11/1993 | Berger et al. | 430/4 |
| 5,260,151 | 11/1993 | Berger et al. | 430/5 |
| 5,279,925 | 1/1994 | Berger et al. | 430/296 |
| 5,334,845 | 8/1994 | Wakabayashi et al. | 250/492.23 |

*Primary Examiner*—Jack I. Berman
*Attorney, Agent, or Firm*—Armstrong, Westerman, Hattori, McLeland & Naughton

[57] ABSTRACT

An electron beam transfer apparatus in which an electron beam emitted from an electron gun (10) is led to a mask (M), and the electron beam having passed through the mask (M) is made incident on a wafer (W) at an intensity correlating with the degree of scattering of the electron beam. The potential difference between the electron gun (10) and the mask (M) is set larger than the potential difference between the electron gun (10) and the wafer (W) so that the electron beam passing through the mask (M) is incident on the wafer (W) at a lower speed than that of the electron beam at the time passing through the mask (M). Thus, it is possible to suppress the reduction of the sensitivity of a resist coated on the wafer (W) and the heat generation at the wafer (W) while satisfactorily obtaining the desired effect of the scattering mask and conditions advantageous to the electron beam as a charged particle beam.

8 Claims, 4 Drawing Sheets

CHARGED PARTICLE BEAM TRANSFER APPARATUS

BACKGROUND OF THE INVENTION

1. Field of the Invention

The present invention relates to an apparatus for transferring an original pattern drawn on a mask onto a surface to which transfer is to be made (hereinafter referred to as "transfer surface") by using a charged particle beam such as an electron beam, an ion beam, etc.

2. Description of the Related Art

Recently, the semiconductor integrated circuit technology has made remarkable progress, and there has been a marked tendency for semiconductor devices to become smaller in size and higher in integration degree. As a lithography system for printing an integrated circuit pattern on a semiconductor wafer, a so-called optical stepper, which uses light, has generally been employed. However, as integrated circuit patterns become finer, the demanded resolution becomes higher, and thus the resolution limit of optical lithography has become a matter of concern. Under these circumstances, lithography systems that use an electron beam, an ion beam, X-rays, etc. have been actively investigated and developed in recent years. Among these radiations, particularly the electron radiation is considered to be most practical, and various electron beam lithography systems have been proposed and developed. Hitherto, electron beam lithography systems have been used in pattern writing for masks and reticles by virtue of the excellent controllability thereof. However, the conventional electron beam exposure systems are designed to write patterns one by one on a radiation-sensitive substrate unlike optical steppers in which pattern transfer is effected by using a mask. Therefore, the conventional electron beam exposure systems involve a long exposure time and have not heretofore been used for lithography of production model wafers from the viewpoint of device production cost.

Electron beam exposure systems that use a mask have also been under development and investigation, and there has been devised a perforated stencil mask having a structure as shown in FIG. 5, in which a base plate BP which blocks an electron radiation is provided with openings OP. The stencil mask suffers, however, from the problems: ① it is impossible to form a doughnut-shaped pattern because no annular opening OP can be provided; and ② a large amount of heat is generated from the mask because the applied electron beam is completely absorbed by the base plate BP. Therefore, the stencil mask could not be put to practical use. However, a scattering mask shown in FIGS. 6(a) and 6(b) has recently been proposed as a mask that solves the above-described demerits of the stencil mask. As shown in FIGS. 6(a) and 6(b), the scattering mask 1 has a thin support film 2 which transmits almost all the applied electron beam or scatters forwardly the electron beam at a small angle, and a scattering film 3 is disposed on the upper side of the support film 2. As shown in FIG. 6(b), an electron beam is batchwise applied to a proper region on the scattering mask 1. Consequently, an electron beam EB2 (shown by the chain double-dashed line in the figure) passing through the scattering film 3 is scattered forwardly to a larger extent than an electron beam EB1 (shown by the solid line in the figure) passing through only the support film 2. An electron beam reduction transfer apparatus is provided with a pair of projection lenses 5 and 6 for projecting a pattern drawn on the scattering mask 1 onto a wafer W as a demagnified image, and a scattering aperture plate 7 disposed between the projection lenses 5 and 6. The scattering aperture plate 7 is provided with an aperture 7a for passing only the electron beam in the vicinity of the center of a crossover image CO formed by the projection lens 5. Because of the difference in the degree of scattering of the electron beam caused by the support film 2 and the scattering film 3, the electron beam EB2 passing through the scattering film 3 is higher than the electron beam EB1 passing through only the support film 2 in terms of the ratio in which the electron beam is intercepted by the scattering aperture plate 7. Thus, the resist coated on the wafer W is exposed in a pattern corresponding to the gap (whited-out portion in FIG. 6(a)) between a pair of adjacent patterns of the scattering film 3. It should be noted that in a system wherein the central portion of the scattering aperture plate 7 is formed as a blocking portion, and an opening is provided around the central portion, the resist is exposed in a pattern corresponding to the pattern of the scattering film 3 in reverse relation to the above.

The electron beam exposure method using the above-described scattering mask is expected to be satisfactorily used for the lithography of semiconductor integrated circuits in the future in terms of both resolution and throughput. In the scattering mask system, since the scattering film 3 can be supported by the support film 2, (i) it is possible to form a doughnut-shaped pattern in which an insular scattering film 3 is present as shown in part A of FIG. 6(a). In addition, (ii) since the applied electron beam need not be completely blocked by the scattering film 3, and hence the amount of electron radiation blocked by the mask portion is reduced, it is possible to suppress the generation of heat in the mask portion by the electron beam irradiation. That is, the above-described problems ① and ② associated with the perforated stencil mask (shown in FIG. 5) are solved.

However, there is a limit to the reduction of the thicknesses of the support and scattering films 2 and 3 of the scattering mask 1, shown in FIGS. 6(a) and 6(b), from the viewpoint of the practical thin film forming technology. That is, in view of the uniformity of film thickness and the film strength, the thickness of each of the support and scattering films 2 and 3 cannot be reduced beyond several tens of nanometers. In order to obtain the above-described effect of the scattering mask at such a film thickness, an electron beam must pass through the mask at a speed of at least about 100 keV. However, if the speed of the electron beam is raised to such a high level, other demerits arise from the viewpoint of exposure: (1) the resist sensitivity reduces; and (2) since the energy applied to a surface to be exposed becomes large, the resist and the wafer generate heat, thereby causing the properties thereof to change.

SUMMARY OF THE INVENTION

An object of the present invention is to provide a charged particle beam transfer apparatus which is provided with a speed control device for allowing a charged particle beam passing through a mask to be incident on a resist coated on a surface of a radiation-sensitive substrate at a lower speed than that of the charged particle beam when it passes through the mask, thereby preventing reduction of the sensitivity of the resist, and also preventing the change of properties of the resist and the radiation-sensitive substrate which would otherwise be caused by heat generation.

Another object of the present invention is to provide a charged particle beam transfer apparatus having the charged particle speed control device arranged such that a potential difference between an irradiation source and the mask is larger than a potential difference between the irradiation source and the radiation-sensitive substrate, thereby enabling the speed control device to be constructed extremely easily with high reliability.

Still another object of the present invention is to provide a charged particle beam transfer apparatus which is designed so that a charged particle beam passes at a high speed as far as a terminating end of an optical system for leading the charged particle beam to a position immediately before a surface to which transfer is to be made, and the charged particle beam is decelerated after passing the terminating end of the optical system, thereby making it possible to reduce optical aberrations and Coulomb distortion.

The arrangement of the present invention may be applied to a charged particle beam transfer apparatus in which a charged particle beam emitted from an irradiation source is led to a mask, and the charged particle beam having passed through the mask is made incident on a surface, to which transfer is to be made, at an intensity correlating with the degree of scattering of the charged particle beam. The charged particle beam transfer apparatus has a speed control device for controlling the speed of the charged particle beam so that the charged particle beam having passed through the mask is incident on the transfer surface at a lower speed than that of the charged particle beam at the time of passing through the mask.

According to another aspect of the present invention, the speed control device is arranged such that a potential difference between the irradiation source and the mask is larger than another potential difference between the irradiation source and the transfer surface.

According to still another aspect of the present invention, the speed control device is arranged such that the charged particle beam passes at a high speed as far as a terminating end of an optical system for leading the charged particle beam to the transfer surface, and the charged particle beam decelerates between the terminating end and the transfer surface.

According to a further aspect of the present invention, the speed control device is arranged such that a potential difference between the irradiation source and the mask is larger than a potential difference between the irradiation source and the transfer surface, and that the whole optical system is set at the same potential as that of the mask.

According to a still further aspect of the present invention, there is provided a charged particle beam transfer apparatus in which a charged particle beam emitted from an irradiation source is led to a mask, and the charged particle beam having passed through the mask is made incident on a surface, to which transfer is to be made, at an intensity correlating with the degree of scattering of the charged particle beam. The charged particle beam transfer apparatus has a first device for setting a first potential difference between the irradiation source and the mask, and a second device for setting a second potential difference between the irradiation source and the transfer surface, the second potential difference being larger than the first potential difference.

PRINCIPLE OF THE INVENTION

Let us consider the transmittance of an electron beam and the contrast at a transfer surface when a silicon nitride film of 50 nm in thickness is selected as a support film, and a tungsten film of 50 nm in thickness as a scattering film, as practical materials for constituting a scattering mask and practical film thicknesses, with reference to FIGS. 3, 4(a) and 4(b). It should be noted that the above film thicknesses are substantially limits for practical thin films in view of the film strength and the film thickness uniformity.

As shown in FIG. 3, the forwardly scattering angle of an electron beam passing through a thin film TF is assumed to be θ. FIGS. 4(a) and 4(b) are graphs showing results of examination of the relationship between the forwardly scattering angle θ on the one hand and the transmittance T (θ) for the electron beam and the contrast C (θ) on the other with regard to two different electron beam speeds of 100 keV and 50 keV. FIG. 4(a) shows the results of the examination for the speed of 100 keV, and FIG. 4(b) shows the examination results for the speed of 50 keV. In each graph, the abscissa axis represents the forwardly scattering angle θ, and the ordinate axis represents the transmittance Tmem (θ) at the support film portion of the scattering mask and the contrast C (θ) obtained at the transfer surface. The transmittance T (θ) is the ratio of the intensity of electron radiation falling within the forwardly scattering angle range of from 0 to θ (the hatched region in FIG. 3), including the transmitted electron radiation, to the intensity of all the electron beam having passed through the thin film TF. The contrast C (θ) is given by $$C(\theta)=1-Tscat(\theta)/Tmem(\theta) \tag{1}$$

where Tmem (θ): the transmittance for the electron beam at the support film portion; and Tscat (θ): the transmittance for the electron beam at the scattering film portion.

It should be noted that the transmittance Tscat (θ) at the scattering film portion includes scattering occurring when the electron beam passes through the support film bonded to the lower side of the scattering film.

In an actual apparatus, as shown in FIG. 6(b), a crossover image CO is formed below the lens 5 disposed below the mask 1, and a stop (aperture) 7a is installed at the position where the crossover image CO is formed. The intensity of the electron beam passing through the aperture 7a is determined according to the scattering angle θ at the mask 1. Accordingly, the transmittance and contrast are determined according to the size of the aperture 7a. Thus, the size of the aperture 7a has one-to-one correspondence to the scattering angle θ.

As will be clear from FIG. 4(b), when the speed is 50 keV, the transmittance is exceedingly low, and the contrast is also low. Therefore, it is difficult to use such a low speed for exposure. The reason for this is that, when the speed of the electron beam is low, the forwardly scattering angle becomes relatively large even at the support film portion. In contrast, when the speed is 100 keV, as shown in FIG. 4(a), it is possible to obtain excellent characteristics for both the transmittance and contrast at the forwardly scattering angle θ=about several mrad. Thus, the electron beam speed of 100 keV can be used for exposure. Accordingly, excellent characteristics can be obtained for the transmittance and contrast by arranging the system such that a charged particle beam passes through the mask portion at a high speed of 100 keV, for example, and after passing the mask portion, the charged particle beam is decelerated to about 50 keV, for example, and made incident on the transfer surface at the reduced speed.

Thus, since the exposure characteristics for the transfer surface are those which are obtained when the electron beam speed is low, the resist sensitivity is improved, and the energy incident on the transfer surface is reduced. In a case where the electron beam once passing through the mask at a speed of 100 keV is thereafter made incident on the transfer surface at a speed of 50 keV as described above, the resist sensitivity becomes about double that in a case where the electron beam is made incident on the transfer surface at 100 keV without changing the speed, and the energy of the electron beam incident on the transfer surface becomes ½ of that in the latter case. On the other hand, it is possible to obtain a resist sensitivity equal to that obtained when the speed is 100 keV by supplying an electric current which is about ½ of that required when the speed is 100 keV. Accordingly, the energy of the electron beam incident on the transfer surface is reduced to about ¼ in total. Thus, it is possible to suppress heat generation at the resist and the transfer surface and minimize the change of properties of these materials caused by heat generation.

If the charged particle beam passes at a high speed as far as the terminating end of the optical system (see reference numeral 11 in FIG. 1) and is decelerated after passing the terminating end of the optical system, optical aberrations and Coulomb distortion are maintained at the levels at the high speed. Thus, exposure can be carried out with smaller aberrations and distortion than in the case of the low speed.

BRIEF DESCRIPTION OF THE DRAWINGS

FIGS. 6(a) and 6(b) are views for explanation of the mask and the transfer principle, in which FIG. 6(a) is a plan view of a scattering mask, and FIG. 6(b) shows the principle of transfer effected by using the scattering mask.

DESCRIPTION OF PREFERRED EMBODIMENTS

First embodiment

Figure 1:
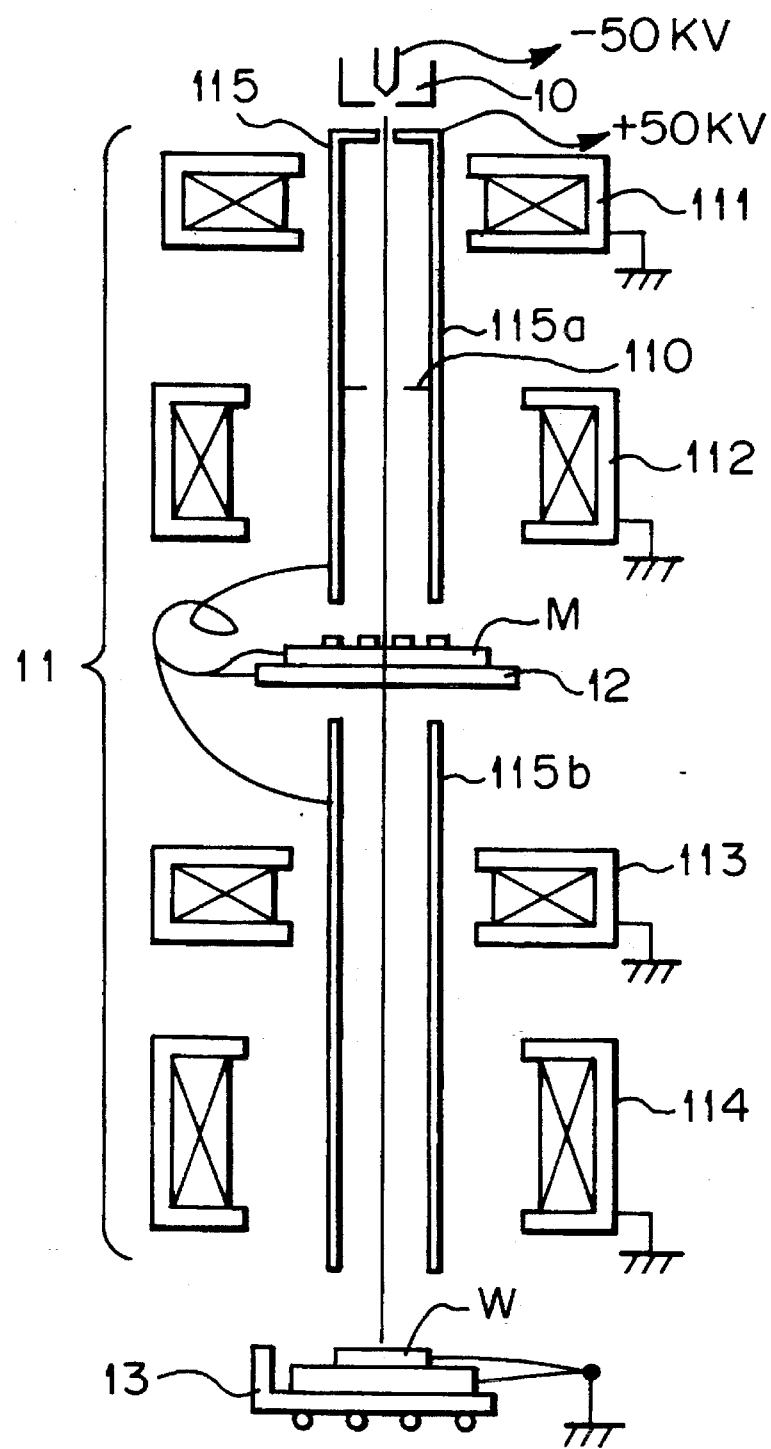
FIG. 1 shows the arrangement of an electron beam transfer apparatus according to a first embodiment of the present invention.

FIG. 1 shows an electron beam transfer apparatus according to a first embodiment of the present invention. An electron gun 10 emits a charged particle beam. An electron beam optical system 11 leads the charged particle beam to a wafer W supported on a wafer stage 13. A mask stage 12 supports a scattering mask M. The electron beam optical system 11 has an aperture plate 110 for shaping the electron beam emitted from the electron gun 10 so as to have a predetermined cross-sectional configuration (e.g. a square), a pair of electromagnetic irradiation lenses 111 and 112 for leading the electron beam to the mask M, a pair of electromagnetic objective lenses 113 and 114 for leading the electron beam passing through the mask M to the wafer W, and a tube 115 for maintaining an electron beam passage, which extends from the anode portion of the electron gun 10 to the lower end of the objective lens 114, under a vacuum condition. It should be noted that, when the size of the mask M is particularly large, the tube 115 may be divided at the position of the mask stage 12 into an upper tube 115a and a lower tube 115b. In the following description, the term "tube 115" is employed to mean a combination of the upper and lower tubes 115a and 115b.

In the above-described apparatus, the electric potential of the electron gun 10 is set at −50 kV. The mask M, the mask stage 12 and the tube 115 are isolated from the earth potential and set at a potential of +50 kV. The aperture plate 110 is set at the same potential as that of the tube 115, whereas the lenses 111 to 114 are earthed. Both the wafer W and the wafer stage 13 are earthed. It should be noted that in a case where an electromagnetic deflection coil or the like is provided outside the tube 115 of the optical system 11, it is earthed in the same way as the lenses 111 to 114. In a case where an electrostatic deflector is installed in the electron beam passage, a deflection voltage is set on the basis of the potential of the tube 115. Alternatively, the tube 115 is cut at the position of the electrostatic deflector, and a deflection voltage is set on the basis of the earth potential. In the latter case, however, the electron beam is decelerated at the position of the electrostatic deflector. Therefore, optical aberrations at that portion show characteristics which are observed at the low speed. It is necessary to take care that a sharp potential change does not cause aberrations to increase.

According to the above-described potential setting, the potential difference between the electron gun 10 and the mask M is 100 kV, and the potential difference between the electron gun 10 and the wafer W is 50 kV. Accordingly, the electron beam emitted from the electron gun 10 passes through the mask M at a speed of 100 keV. Then, the electron beam decelerates at the terminating end of the optical system 11, and it is incident on the resist coated on the surface of the wafer W at a speed of 50 keV. It should be noted that, when the potential of the mask M is set at +50 kV and the lower tube 115b is earthed, the electron beam is also incident on the wafer W at a lower speed than that of the electron beam when it passes through the mask M.

Second embodiment

Figure 2:
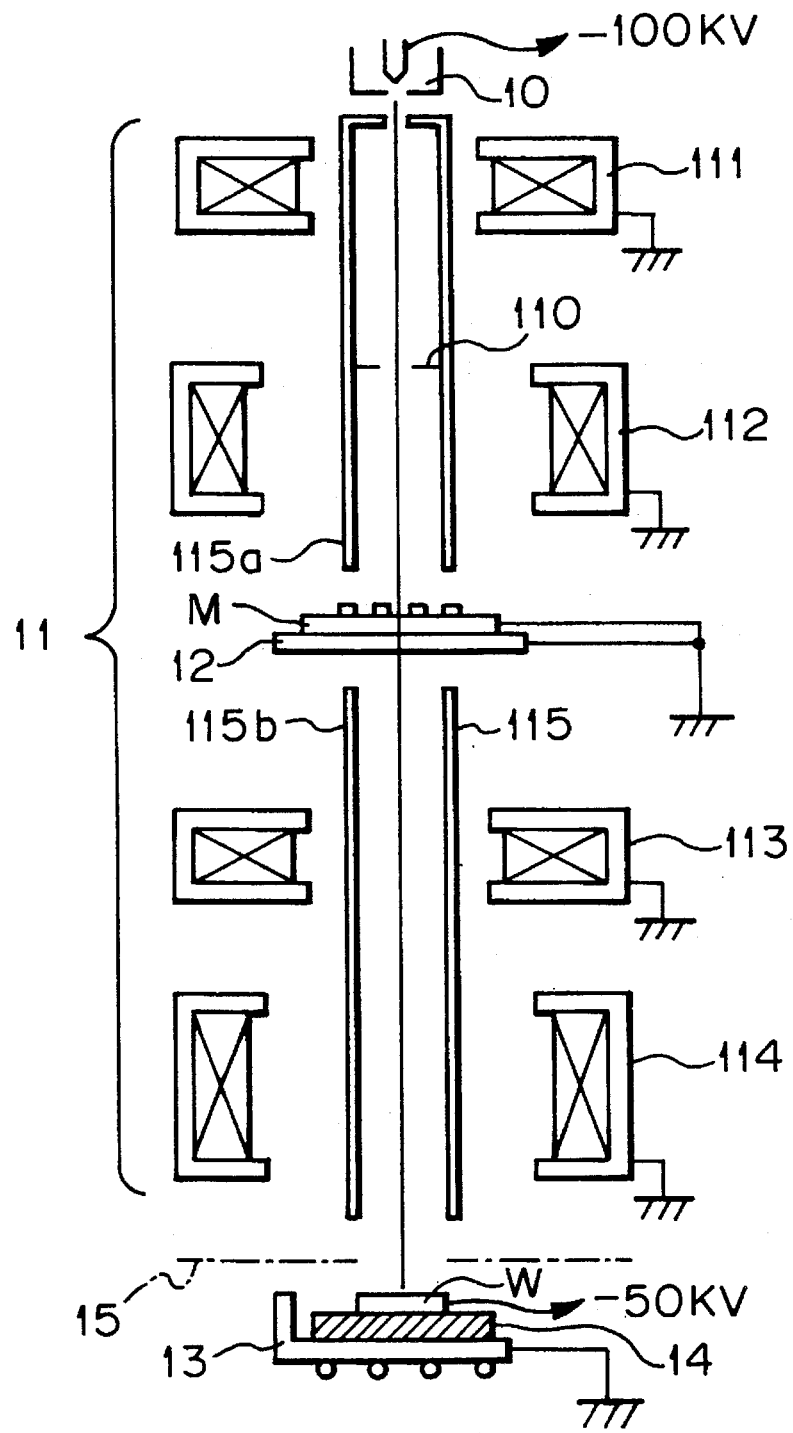
FIG. 2 shows the arrangement of an electron beam transfer apparatus according to a second embodiment of the present invention.
Figure 3:
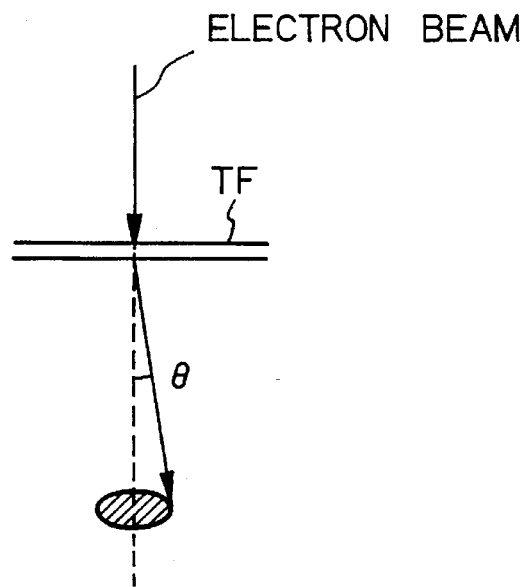
FIG. 3 is a view for explanation of a forwardly scattering angle as a premise for illustration of the relationship between the forwardly scattering angle of an electron beam having passed through a thin film on the one hand and the transmittance and contrast on the other, as shown in FIGS. 4(a) and 4(b).
Figure 4A:
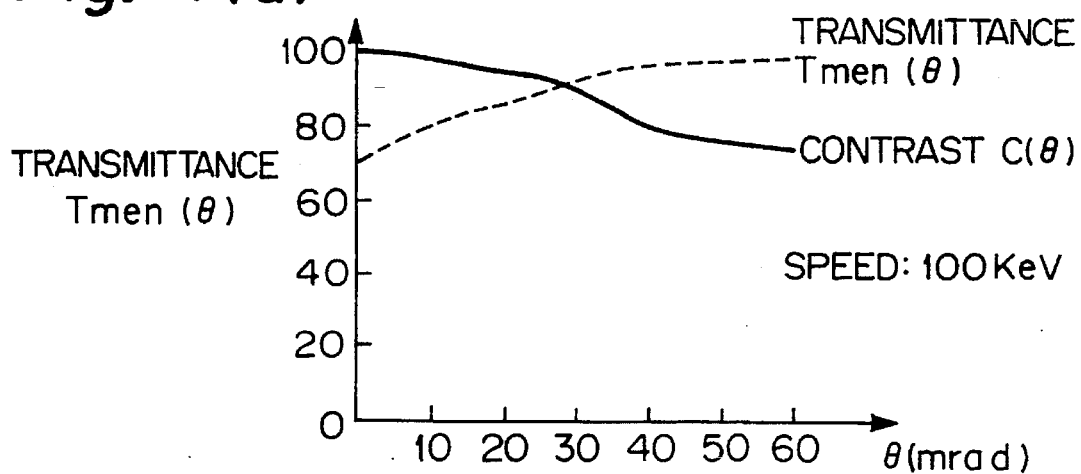
FIG. 4(a) is a graph showing the transmittance and contrast when the speed of the electron beam is 100 keV in FIG. 3.
Figure 4B:
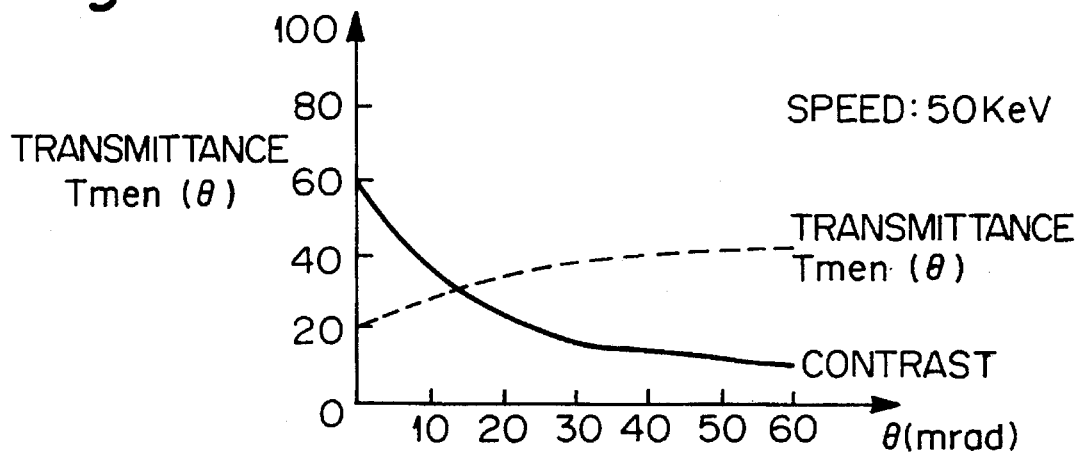
FIG. 4(b) is a graph showing the transmittance and contrast when the speed of the electron beam is 50 keV in FIG. 3.
Figure 5:
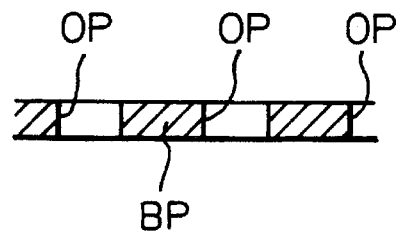
FIG. 5 is a sectional view for explanation of a mask used in an electron beam transfer apparatus and the transfer principle, particularly showing a perforated stencil mask.

FIG. 2 shows an electron beam transfer apparatus according to a second embodiment of the present invention. In the figure, constituent members or portions which are common to the two arrangements shown in FIGS. 1 and 2 are denoted by the same reference numerals.

In this embodiment, the potential of the electron gun 10 is set at −100 keV. The whole optical system 11, the mask M, the mask stage 12 and the wafer stage 13 are earthed. In a case where an electrostatic deflector is installed in the optical system 11, a deflection voltage set on the basis of the earth potential is applied to the electrostatic deflector. In addition, an insulator 14 is interposed between the wafer W and the wafer stage 13, and only the wafer W is set at a potential of −50 kV.

According to the above-described arrangement, all the potential differences between the electron gun 10 on the one hand and the mask M, the mask stage 12 and the whole optical system 11 on the other are 100 kV, and only the potential difference between the electron gun 10 and the wafer W is 50 kV. Accordingly, the electron beam emitted from the electron gun 10 passes at a high speed of 100 keV as far as the terminating end of the optical system 11, and decelerates to a speed of 50 keV after passing the terminating end of the optical system 11. Then, the electron beam is incident on the wafer W at the reduced speed. It should be noted that, when the effect of the potential of the wafer W on the speed of the electron beam in the optical system 11 is unignorable, a shield 15 should be provided between the wafer W and the lower end of the optical system 11, as shown by the chain double-dashed line in FIG. 2.

In the foregoing embodiments, the electron gun 10 constitutes an irradiation source, and the resist-coated surface of the wafer W constitutes a surface to which transfer is to be made. It should, however, be noted that the present invention is not necessarily limited to transfer apparatuses that use an electron beam, but may be applied to transfer apparatuses that use other charged particle beams such as an ion beam.

Figure 6A:
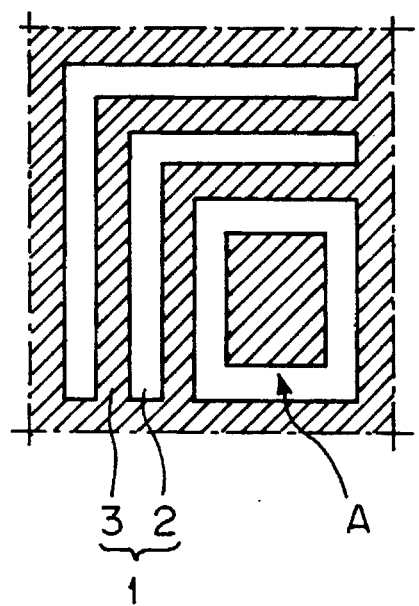
Figure 6B:
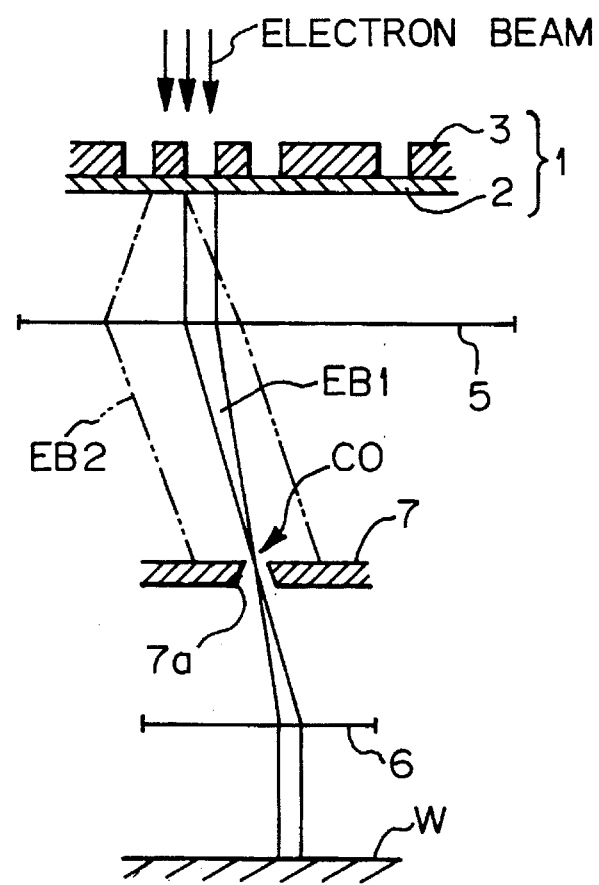

In the foregoing embodiments (FIGS. 1 and 2), illustration of the stop 7 as shown in FIG. 6(b) is omitted.

As has been described above, in the present invention, a charged particle beam having passed through a mask is made incident on a transfer surface at a lower speed than that of the charged particle beam at the time of passing through the mask. Accordingly, when a scattering mask is used, it is possible to raise the transmittance for the charged particle beam at the support film portion and, at the same time, to improve the contrast at the transfer surface. In addition, since the charged particle beam is incident on the transfer surface at a relatively low speed, it is possible to suppress the reduction of the resist sensitivity and the heat generation at the transfer surface and minimize the change of properties of the transfer surface caused by the heat generation.

In particular, the arrangements according to the third and fourth aspects of the present invention make it possible to suppress the reduction of the resist sensitivity and the heat generation at the transfer surface and minimize the change of properties of the transfer surface while reducing aberrations and Coulomb distortion of the charged particle beam passing through the optical system.

What is claimed is:

1. A charged particle beam transfer apparatus in which a charged particle beam emitted from an irradiation source is led to a mask, and the charged particle beam having passed through said mask is made incident on a surface, to which transfer is to be made, at an intensity correlating with a degree of scattering of said charged particle beam, said charged particle beam transfer apparatus comprising:

a speed control device for controlling a speed of said charged particle beam so that said charged particle beam having passed through said mask is incident on said surface at a lower speed than that of said charged particle beam at the time of passing through said mask.

2. An apparatus according to claim 1, wherein said speed control device is arranged such that a potential difference between said irradiation source and said mask is larger than another potential difference between said irradiation source and said surface.

3. An apparatus according to claim 1, wherein said speed control device is arranged such that said charged particle beam passes at a high speed as far as a terminating end of an optical system for leading said charged particle beam to said surface, and said charged particle beam decelerates between said terminating end and said surface.

4. An apparatus according to claim 3, wherein said speed control device is arranged such that a potential difference between said irradiation source and said mask is larger than a potential difference between said irradiation source and said surface, and that the whole optical system is set at the same potential as that of said mask.

5. An apparatus according to claim 3 or 4, further comprising a shield member which is provided between said surface and the terminating end of said optical system.

6. A charged particle beam transfer apparatus in which a charged particle beam emitted from an irradiation source is led to a mask, and the charged particle beam having passed through said mask is made incident on a surface, to which transfer is to be made, at an intensity correlating with a degree of scattering of said charged particle beam, said charged particle beam transfer apparatus comprising:

a first device for setting a first potential difference between said irradiation source and said mask; and a second device for setting a second potential difference between said irradiation source and said surface, said second potential difference being larger than said first potential difference.

7. An apparatus according to claim 6, wherein said second potential difference setting device sets said surface at an earth potential.

8. An apparatus according to claim 6, wherein said first potential difference setting device sets said mask at an earth potential.

\* \* \* \* \*